(12) United States Patent
Hu

(10) Patent No.: US 9,312,219 B2
(45) Date of Patent: Apr. 12, 2016

(54) INTERPOSER AND PACKAGING SUBSTRATE HAVING THE INTERPOSER

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 146 days.

(21) Appl. No.: 13/730,019

(22) Filed: Dec. 28, 2012

(65) Prior Publication Data

US 2014/0182906 A1 Jul. 3, 2014

(51) Int. Cl.
*H05K 1/00* (2006.01)
*H01L 23/498* (2006.01)
*H05K 3/46* (2006.01)
*H01L 23/15* (2006.01)
*H01L 23/00* (2006.01)

(52) U.S. Cl.
CPC ........ *H01L 23/49827* (2013.01); *H01L 23/15* (2013.01); *H01L 24/13* (2013.01); *H01L 24/16* (2013.01); *H01L 24/32* (2013.01); *H01L 24/73* (2013.01); *H01L 2224/13111* (2013.01); *H01L 2224/16237* (2013.01); *H01L 2224/32225* (2013.01); *H01L 2224/73204* (2013.01); *H01L 2224/81191* (2013.01); *H01L 2924/12042* (2013.01); *H01L 2924/15174* (2013.01); *H01L 2924/15311* (2013.01); *H05K 3/4688* (2013.01)

(58) Field of Classification Search
CPC ... H05K 1/0306; H05K 1/183; H05K 1/0296; H05K 2201/10378; H01L 23/49827

USPC ............................................. 257/4
See application file for complete search history.

(56) References Cited

U.S. PATENT DOCUMENTS

| | | | | |
|---|---|---|---|---|
| 4,851,615 A * | 7/1989 | Butt | ...................... | H05K 1/053 156/89.18 |
| 5,644,327 A * | 7/1997 | Onyskevych | ............ | G09G 3/30 313/503 |
| 6,952,049 B1 * | 10/2005 | Ogawa et al. | .................. | 257/700 |
| 2005/0189636 A1 * | 9/2005 | Savastiouk et al. | ........... | 257/678 |
| 2006/0163740 A1 * | 7/2006 | Ohno et al. | ..................... | 257/762 |
| 2007/0210447 A1 * | 9/2007 | Kinsley | .......................... | 257/723 |
| 2009/0233047 A1 * | 9/2009 | Palanduz | ...................... | 428/137 |
| 2010/0025081 A1 * | 2/2010 | Arai et al. | ...................... | 174/251 |
| 2010/0276187 A1 * | 11/2010 | Nakamura et al. | ............ | 174/258 |
| 2011/0024916 A1 * | 2/2011 | Marimuthu et al. | .......... | 257/774 |
| 2011/0063806 A1 * | 3/2011 | Kariya et al. | .................. | 361/748 |
| 2011/0080713 A1 * | 4/2011 | Sunohara | ....................... | 361/760 |
| 2011/0147059 A1 * | 6/2011 | Ma et al. | ........................ | 174/258 |
| 2012/0189826 A1 * | 7/2012 | Hayashi | ..................... | 428/195.1 |
| 2013/0037943 A1 * | 2/2013 | Yamano | ......................... | 257/737 |
| 2014/0078704 A1 * | 3/2014 | Andry et al. | .................. | 361/764 |

* cited by examiner

*Primary Examiner* — Steven T Sawyer
(74) *Attorney, Agent, or Firm* — Hauptman Ham, LLP

(57) ABSTRACT

An interposer is provided, including a composite body and a plurality of conductive through vias penetrating the composite body. The composite body includes at least a main layer and at least a combining layer stacked on one another. The combining layer prevents the main layer from being cracked. The combining layer is more flexible than the main layer. The combining layer prevents the main layer from being cracked. Therefore, the main layer can be thinned on demands, and the interposer can be thinned accordingly.

20 Claims, 4 Drawing Sheets

INTERPOSER AND PACKAGING SUBSTRATE HAVING THE INTERPOSER

BACKGROUND OF THE INVENTION

1. Field of the Invention

This invention relates to semiconductor technologies, and, more particularly, to an interposer and a packaging substrate including the interposer.

2. Description of Related Art

With the rapid development of electronic industry, electronic products are designed to be low-profiled and compact-sized and have a variety of functionality, and can operate at a high speed. To meet the requirements, an electronic product is provided with more and more electronic elements, and a conventional 2D planar integration technique (e.g., side-by-side) evolves into a 3D IC technique. The 3D IC technique integrates a plurality of chips in a 3D space vertically, to achieve the objective of miniaturization. The 3D IC technique differs from the 2D IC technique in that the 3D IC technique employs conductive structures that conduct upper side and lower side of a chip and thus shortens the length of traces provided on the chip.

Since the 3D IC technique is not mature yet, a 2.5D IC technique acts as a transitional technology. The 2.5D IC technique solves the problem of the prior art that the reliability is reduced due to the mismatch between coefficients of thermal expansion (CTE) of the chip and a packaging substrate by providing an interposer between the chip and the packaging substrate. Since the interposer and the chip are made of similar materials, and have approximately the same CTEs, the mismatch problem can thus be solved.

FIGS. 1A-1C illustrate a method of fabricating an interposer according to the prior art.

As shown in FIG. 1A, a plurality of through vias 100 are formed on a complete sheet of a glass body 10.

As shown in FIG. 1B, a metal material is formed in the through vias 100 to form conductive through vias 11.

As shown in FIG. 1C, a redistribution layer (RDL) 12 is formed on an upper side of the glass body 10, a lower side of the glass body 10 is polished to expose the conductive through vias 11, and another redistribution layer 12' is formed on the lower side of the glass body 10 and exposed surfaces of the conductive through vias 11, such that the interposer 1 is fabricated. The redistribution layers 12 and 12' are electrically connected to the conductive through vias 11. A plurality of conductive pads 120 are disposed on the upper-side redistribution layer 12. A plurality of conductive pads 120' are disposed on the lower-side redistribution layer 12'.

In a subsequent flip-chip process, as shown in FIG. 1D, a singulation process is performed on the interposer 1 along a cut route L shown in FIG. 1C, and the singulated interposer 1 is disposed between the packaging substrate 8 and a semiconductor chip 9. Bottom ends of the conductive through vias 11 are electrically connected to the packaging substrate 8 via the conductive pads 120'. The conductive pads 120 disposed on the upper-side redistribution layer 12 are electrically connected to the semiconductor chip 9.

In the prior art, the interposer 1 is made of a single material (i.e., the glass body 10). As a thin interposer 1 is popular in the market, the glass body 10 has to have a thickness reduced accordinly. However, too thin the glass body 10 is likely to be cracked, and has a yield rate less than 50%. In the prior art, the thickness of the glass body 10 of the interposer 1 has to be more than 100 μm. Therefore, the interposer 1 cannot be thinned any further.

Therefore, how to solve the problem of the prior art is becoming an urgent issue in the art.

SUMMARY OF THE INVENTION

In view of the above-mentioned problems of the prior art, the present invention provides an interposer, including a composite body having at least a main layer and at least a combining layer stacked on one another. The combining layer prevents the main layer from being cracked. The combining layer is more flexible than the main layer. The interposer further comprises a plurality of conductive through vias penetrating the composite body.

The present invention further provides a packaging substrate, comprising a carrying structure and an interposer embedded in the carrying structure. The interposer comprises a composite body and a plurality of conductive through vias penetrating the composite body. The composite body has at least a main layer and at least a combining layer stacked on one another. The combining layer prevents the main layer from being cracked. The combining layer is more flexible than the main layer.

In an embodiment, the carrying structure includes a core layer, and the interposer is embedded in the core layer; a built-up structure is disposed on the core layer and electrically connected to the conductive through vias of the interposer; the core layer has an opening, and the interposer is received in the opening.

In an embodiment, the main layer is made of glass, silicon or ceramics.

In an embodiment, the composite body has a plurality of the main layers, and the main layers are made of the same or different materials.

In an embodiment, the combining layer is made of an adhesive material or a dielectric material.

In an embodiment, the combining layer is disposed between any two of the main layers.

In an embodiment, the composite body has an outermost layer that is the combining layer.

In an embodiment, a redistribution layer is disposed on the composite body and electrically connected to the conductive through vias, and the redistribution layer has a plurality of conductive pads.

Through the use of the composite body, which comprises the main layer and the combining layer that is more flexible than the main layer and can prevent the main layer from being cracked, the interposer and the packaging substrate according to the present invention can be made thinner, as compared with a silicon interposer of the prior art that comprises a single material. For example, the main layer can be formed as thin as 25 μm. Therefore, the interposer can be thinned on demands.

BRIEF DESCRIPTION OF DRAWINGS

The invention can be more fully understood by reading the following detailed description of the preferred embodiments, with reference made to the accompanying drawings, wherein:

FIG. 2D' is another embodiment of FIG. 2D;

FIG. 2E' is another embodiment of FIG. 2E;

FIG. 4' is another embodiment of FIG. 4.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A-2E are cross-sectional diagrams illustrating a method of fabricating interposers 2a, 2a' and 2a" and packaging substrates 2 and 2' according to the present invention.

Figure 1A:
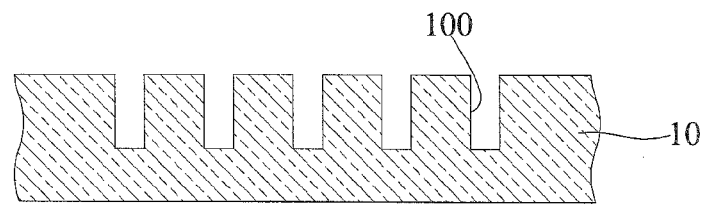
FIGS. 1A-1C are cross-sectional diagrams illustrating a method of fabricating an interposer according to the prior art.
Figure 1B:
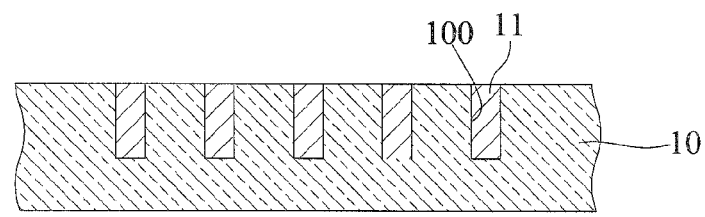
Figure 1C:
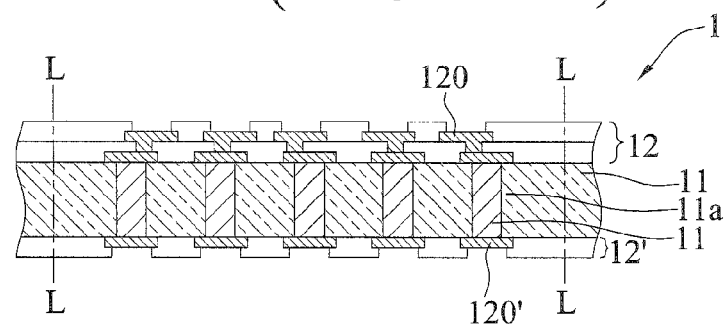
Figure 1D:
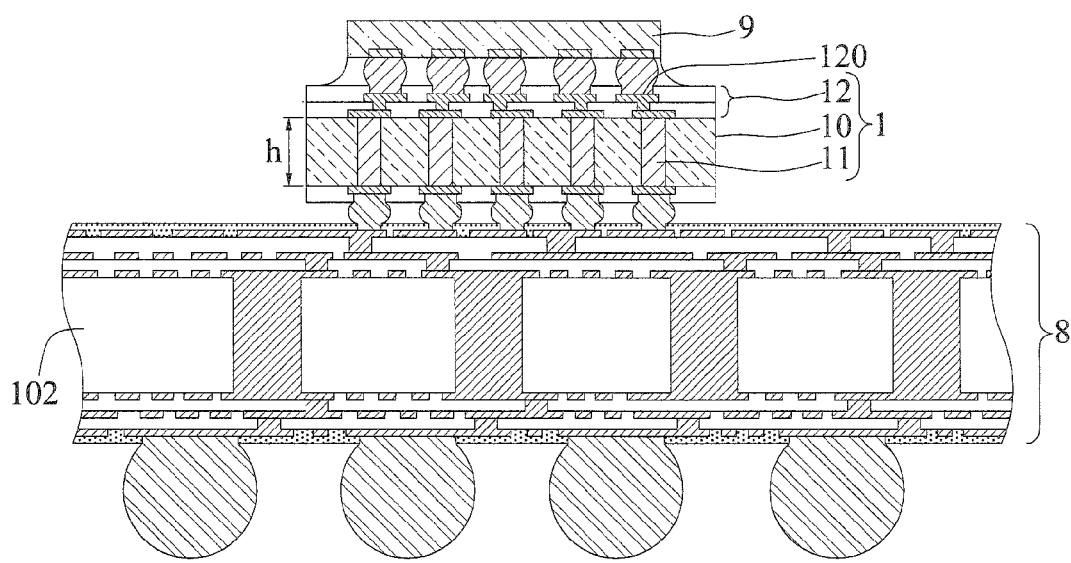
FIG. 1D is a cross-sectional diagram of the interposer shown in FIGS. 1A-1C during a subsequent process.
Figure 2A:
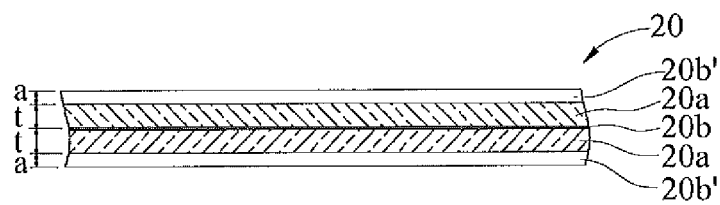
FIGS. 2A-2D are cross-sectional diagrams illustrating a method of fabricating an interposer according to the present invention.

As shown in FIG. 2A, a composite body 20 is provided. The composite body 20 comprises a plurality of main layers 20a and a plurality of combining layers 20b stacked on one another. The main layers 20a and the combining layers 20b and 20b' are made of different materials. The combining layers 20b and 20b' are more flexible than the main layers 20a. Therefore, the combining layers 20b and 20b' are less likely to be cracked than the main layers 20a when an external force is applied thereto.

In an embodiment, the flexibility of the combining layers 20b and 20b' and the main layers 20a is determined by Young's modules, which is a reference for selecting a material.

The main layers 20a are made of glass, silicon, or ceramics, such as $Al_2O_3$ and AlN (aluminum nitride). The combining layers 20b and 20b' are made of an adhesive material such as a resin or a dielectric material, such as polyimide (PI) and benzocyclobutene (BCB). The main layers 20a are made of the same or different materials.

The combining layer 20b that is made of an adhesive material is disposed between two main layers 20a. The composite body 20 has an outermost layer that is the combining layer 20b' that is made of a dielectric material.

The thickness t of the main layers 20a is less than 50 µm, e.g., 25 µm, or less. The combining layer 20b that is made of an adhesive material is very thin, and the thickness of the combining layer 20b is neglected. The thickness a of the combining layer 20b' that is made of a dielectric material is less than 10 µm, e.g., 5 µm, or less.

Figure 2B:
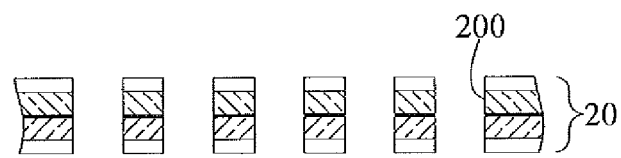

As shown in FIG. 2B, the composite body 20 is penetrated by laser to form a plurality of through vias 200.

Figure 2C:
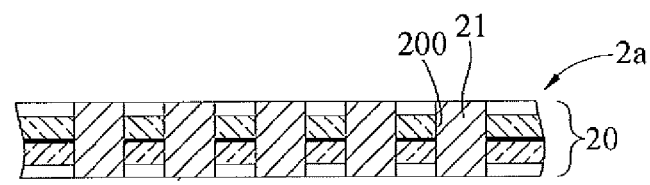

As shown in FIG. 2C, a metal layer is formed in the through vias 200 to form conductive through vias 21 and fabricate an interposer 2a. If the main layer 20a is made of silicon, an insulation material has to be formed on walls of the through vias 200 first, and the metal material is formed on the insulation material thereafter.

Figure 2D:
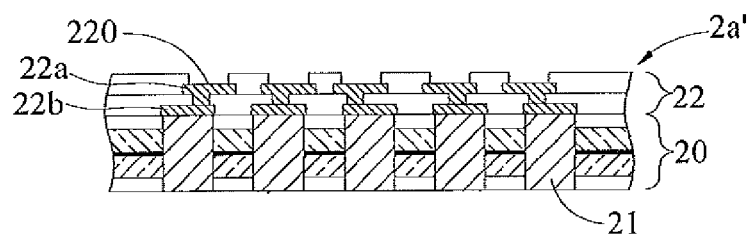
Figure 2D:
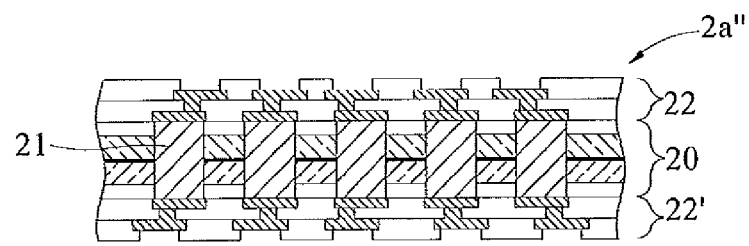

As shown in FIG. 2D, a redistribution layer (RDL) 22 is formed on one side (e.g., an upper side) of the composite body 20. The redistribution layer 22 has an innermost circuit 22b electrically connected to the conductive through vias 21 and an outermost circuit 22a having a plurality of conductive pads 220, for fabricating another interposer 2a'.

In another embodiment, as shown in FIG. 2D', redistribution layers 22 and 22' are formed on two opposite sides (i.e., the upper and lower sides) of the composite body 20, respectively, and electrically connected to the conductive through vias 21, to fabricate another interposer 2a".

Figure 2E:
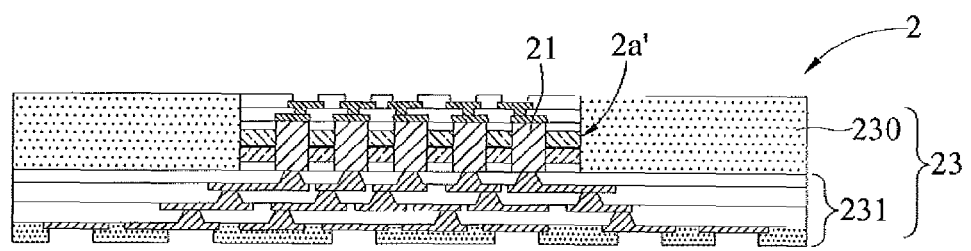
FIG. 2E is a cross-sectional diagram illustrating a method of fabricating a packaging substrate according to the present invention.
Figure 2E:
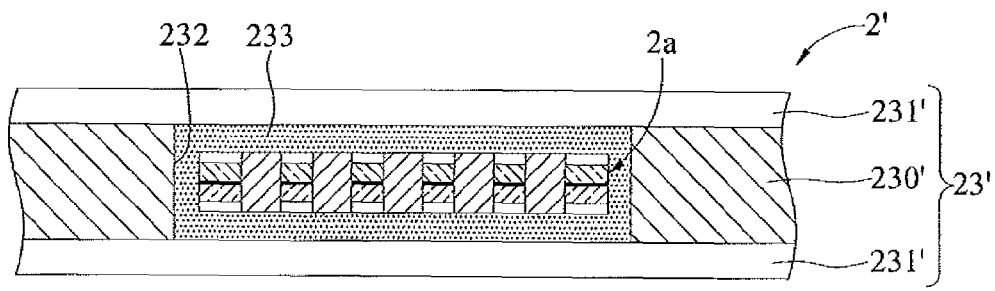

As shown in FIG. 2E, a singulation process is performed on the interposer 2a' shown in FIG. 2D, and the singulated interposer 2a' is embedded in a carrying structure 23, to fabricate a packaging substrate 2.

In an embodiment, the carrying structure 23 comprises a core layer 230 such as packaging resin, and a built-up structure 231. The interposer 2a' is embedded in the core layer 230 and exposed from the core layer 230, and the built-up structure 231 is disposed on a lower side of the core layer 230 and electrically connected to the conductive through vias 21 of the interposer 2a'.

In another embodiment, as shown in FIG. 2E', the carrying structure 23' comprises a core layer 230' such as resin, and two covering layers 231' formed on the core layer 230a'. The core layer 230' has an opening 232, and the interposer 2a shown in FIG. 2C is received in the opening 232. A filling material 233 is filled in the opening 232 to fix the interposer 2a. The two covering layers 231' cover the interposer 2a. A circuit structure (not shown) is then formed on the covering layers 231' and electrically connected to the conductive through vias 21 of the interposer 2a, to fabricate another packaging substrate 2'. In another embodiment, the two covering layers 231' are formed by flowing glue into the opening 232 to fix the interposer 2a. The filling material 233 and the two covering layers 231' are made of the same material.

Figure 2F:
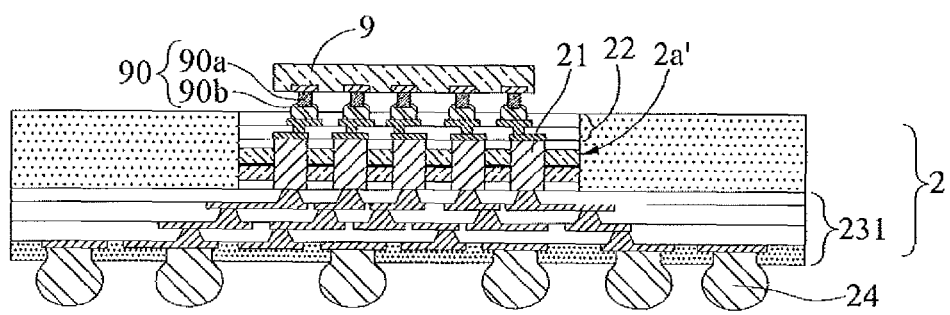
FIGS. 2F and 2F' are cross-sectional diagrams of subsequent processes of FIGS. 2E and 2D', respectively.
Figure 2F:
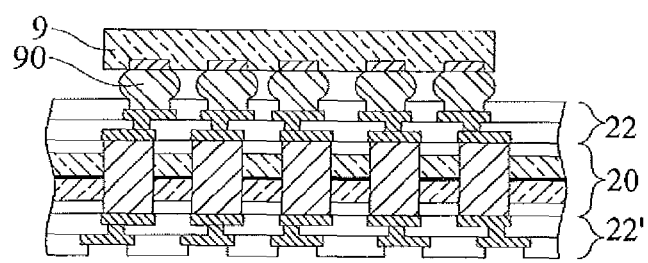

Take the structure shown in FIG. 2E as an example. In subsequent processes, as shown in FIG. 2F, at least one semiconductor chip 9 is disposed in a flip-chip manner on the packaging substrate 2, and solder balls 24 are formed on the built-up structure 231. In an embodiment, the semiconductor chip 9 is coupled to the interposer 2a' via a plurality of conductive bumps 90 (including copper posts 90a and a tin solder material 90b) and electrically connected to the redistribution layer 22 and the conductive through vias 21.

As shown in FIG. 2F', the semiconductor chip 9 can also be disposed in a flip-chip manner on the interposer 2a" shown in FIG. 2D (or the interposers 2a and 2a' having other configurations). In an embodiment, the semiconductor chip 9 is coupled via a plurality of conductive bumps 90 to the interposer 2a" and electrically connected to the redistribution layers 22 and 22' and the conductive through vias 21.

The interposer 2a, 2a', 2a" according to the present invention has the composite body 20, which is designed to have the combining layer 20b' 20b' more flexible than the main layer 20a. By contrast, an interposer of the prior art is made of a single material such as a glass body. Therefore, the main layer 20a (such as glass), even if being made to be very thin, will not be cracked because the combining layer 20b, 20b' is flexible enough to prevent the main layer 20a from being cracked. The thickness t of the main layer 20a can be reduced on demands, such as 25 µm or even 5 µm, and the interposer 2a, 2a', 2a" can thus be thinned accordingly.

Since the combining layer 20b, 20b' can prevent the main layer 20a from being cracked, the yield rate of the composite body 20 is increased. For example, the thinned composite body 20 has a yield rate greater than 50%.

The packaging substrate 2, 2', since being fabricated by embedding the interposer 2a, 2a', 2a" into the carrying structure 23, is far thinner than a stack structure of a packaging substrate and a silicon interposer of the prior art.

Figure 3:
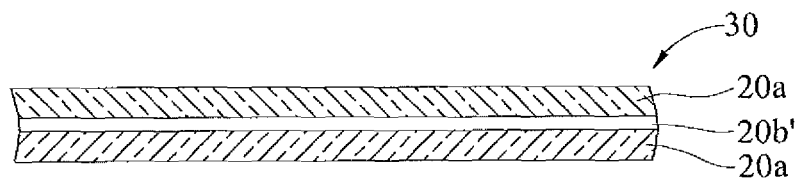
FIGS. 3-6 are cross-sectional diagrams of a composite body of an interposer of another embodiment according to the present invention.
Figure 4:
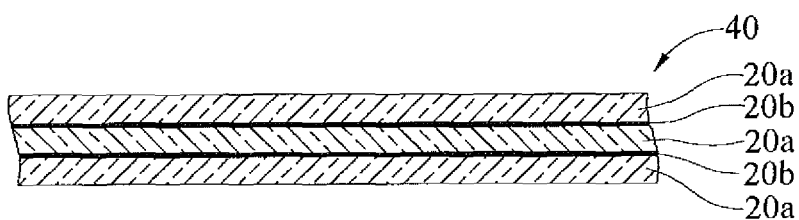
Figure 4:
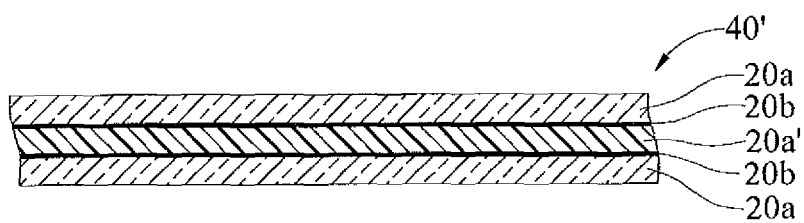
Figure 5:
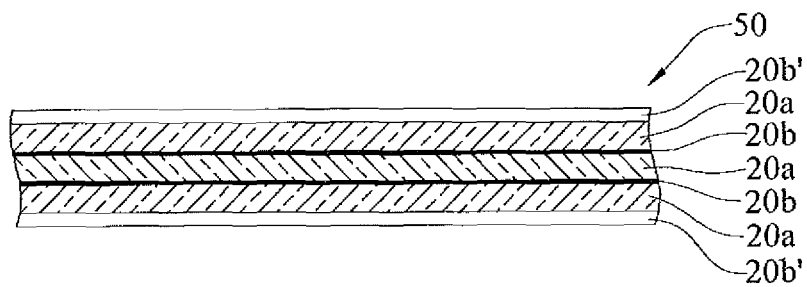

FIGS. 3-5 show other embodiments of composite bodies 30, 40, 40', 50 and 60 of an interposer according to the present invention.

As shown in FIG. 3A, the composite body 30 comprises two main layers 20a and a combining layer 20b' made of a dielectric material that is sandwiched between the two main layers 20a.

In an embodiment, the main layers 20a are made of the same material. In another embodiment, the main layers 20a are made of different materials.

As shown in FIG. 4, the composite body 40 comprises three main layers 20a and two combining layers 20b made of an adhesive material that are disposed among the main layers 20a.

In an embodiment, the main layers 20a are made of the same material. In a composite body 40' of another embodiment, as shown in FIG. 4', the middle one of the three main layers 20a is made of ceramics, and the two outer ones are made of glass.

As shown in FIG. 5, the composite body 50 comprise two combining layers 20b' made of a dielectric material, three main layers 20a, and two combining layer' 20b made of an adhesive material stacked on one another, and the three main layers 20a and the two combining layers 20b are sandwiched between the two combining layers 20b'.

In an embodiment, the main layers 20a are made of the same material. In another embodiment, the main layers 20a are made of different materials.

Figure 6:

As shown in FIG. 6, the composite body 60 comprises a combining layer 20b' made of a dielectric material and a main layer 20a.

Therefore, the interposer 2a, 2a', 2a'' according to the present invention comprises a composite body 20, 30, 40, 40', 50, 60 and a plurality of conductive through vias 21 penetrating the composite body 20, 30, 40, 40', 50, 60.

The composite body 20, 30, 40, 40', 50, 60 comprises at least a main layer 20a and at least a combining layer 20b, 20b' stacked on one another. The main layer 20a, 20a' is made of glass, silicon, or ceramics. The combining layer 20b, 20b' is more flexible than the main layer 20a, 20a'.

In an embodiment, the composite body 20, 30, 40, 40', 50 has a plurality of the main layers 20a and 20a', and the main layers 20a and 20a' have the same or different materials.

In an embodiment, the combining layer 20b, 20b' of the composite body 20, 30, 40, 40', 50 is disposed between any two main layer 20a and 20a'.

In an embodiment, the composite body 20, 50, 60 has an outermost layer that is the combining layer 20b.

In an embodiment, the combining layer 20b, 20b' is made of an adhesive material or a dielectric material.

The interposer 2a', 2a'' further comprises a redistribution layer 22, 22' disposed on the composite body 20 and electrically connected to the conductive through vias 21, and the redistribution layer 22, 22' has a plurality of conductive pads 220.

In a packaging substrate 2, 2' according to the present invention, the interposer 2a, 2a', 2a'' is embedded into a carrying structure 23, 23'

Through the use of the composite body, which comprises the main layer and the combining layer that is more flexible than the main layer and can prevent the main layer from being cracked, the interposer and the packaging substrate according to the present invention can be made thinner, as compared with a silicon interposer of the prior art that comprises a single material. Therefore, the interposer can be thinned on demands and the yield rate is increased.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. An interposer, comprising: a composite body comprising: a first main layer of a material selected from the group consisting of glass, silicon and ceramic, a second main layer of a material selected from the group consisting of glass, silicon and ceramic, and an adhesive layer disposed between the first main layer and the second main layer, wherein the adhesive layer is in direct surface contact with the first and second main layers and combines the first main layer to the second main layer; and a plurality of conductive through vias passing through the composite body, wherein a thickness of the adhesive layer is smaller than a thickness of each of the first and second main layers: the composite body has a first outermost layer that is a first dielectric layer, the first dielectric layer is disposed on the first main layer, and each of the conductive through vias has a straight sidewall that extends continuously, without interruption, through the first dielectric layer, the first main layer, the adhesive layer, and the second main layer; wherein a conductive material of each of the conductive through vias extends continuously, without interruption, through the first dielectric layer, the first main layer, the adhesive layer, and the second main layer; and wherein the first dielectric layer is in direct surface contact with the first main layer, is more flexible than the first and second main layers, and has a thickness greater than the thickness of the adhesive layer.

2. The interposer of claim 1, wherein the adhesive layer comprises polyimide (PI) or benzocyclobutene (BCB).

3. The interposer of claim 1, wherein the composite body has a second outermost layer that is a second dielectric layer, the second dielectric layer is disposed on the second main layer, and the conductive material and the sidewall of each of the conductive through vias extend continuously, without interruption, through the first dielectric layer, the first main layer, the adhesive layer, the second main layer, and the second dielectric layer.

4. The interposer of claim 1, further comprising: a redistribution layer disposed on the first dielectric layer and electrically connected to the conductive through vias, wherein the redistribution layer has a plurality of conductive pads.

5. The interposer of claim 1, wherein the adhesive layer is more flexible than the first and second main layers.

6. The interposer of claim 3, wherein the second dielectric layer is in direct surface contact with the second main layer, is more flexible than the first and second main layers, and has a thickness greater than the thickness of the adhesive layer.

7. The interposer of claim 3, further comprising:
a first redistribution layer disposed on top of the first dielectric layer and electrically connected to the conductive through vias; and
a second redistribution layer disposed on bottom of the second dielectric layer and electrically connected to the conductive through vias,
wherein a number of conductive layers in the second redistribution layer is greater than a number of conductive layers in the first redistribution layer.

8. The interposer of claim 6, wherein the thickness of each of the first and second dielectric layers is less than 10 μm.

9. The interposer of claim 7, further comprising:
a chip on top of and electrically coupled to the first redistribution layer.

10. The interposer of claim 7, further comprising:
a packaging material wrapping four sides of both the composite body and the first redistribution layer,
wherein the second redistribution layer extends over and covers a bottom of the packaging material.

11. A packaging substrate, comprising:
a carrying structure; and
an interposer embedded in the carrying structure and comprising:
    a composite body comprising:
        a first main layer of a material selected from the group consisting of glass, silicon and ceramic,
        a second main layer of a material selected from the group consisting of glass, silicon and ceramic,
        a third main layer of a material selected from the group consisting of glass, silicon and ceramic,
        a first adhesive layer disposed between the first main layer and the second main layer, wherein the first adhesive layer is in direct surface contact with the first and second main layers and combines the first main layer to the second main layer,
        a second adhesive layer disposed between the second main layer and the third main layer, wherein the second adhesive layer is in direct surface contact with the second and third main layers and combines the second main layer to the third main layer,
        a first outermost layer that is a first dielectric layer, the first dielectric layer disposed on the first main layer,
        a second outermost layer that is a second dielectric layer, the second dielectric layer disposed on the third main layer;
    a plurality of conductive through vias passing through the composite body;
    a first redistribution layer disposed on top of the first dielectric layer and electrically connected to the conductive through vias; and
    a second redistribution layer disposed on bottom of the second dielectric layer and electrically connected to the conductive through vias,
        wherein a number of conductive layers in the second redistribution layer is greater than a number of conductive layers in the first redistribution layer.

12. The packaging substrate of claim 11, wherein the carrying structure comprises a core layer, and the interposer is embedded in the core layer.

13. The packaging substrate of claim 11, wherein a thickness of the second redistribution layer is greater than a thickness of the first redistribution layer.

14. The packaging substrate of claim 11, wherein each of the first and second adhesive layers comprises polyimide (PI) or benzocyclobutene (BCB).

15. The packaging substrate of claim 11, wherein
the first and third main layers are made of the same material, and
the second main layer is made of a material different from the material of the first and third main layers.

16. The packaging substrate of claim 11, wherein
a thickness of each of the first and second adhesive layers is smaller than a thickness of each of the first, second and third main layers.

17. The packaging substrate of claim 12, wherein
the core layer has an opening,
the interposer is received in the opening, and
the carrying structure further comprises:
    a filling material filled in the opening to fix the interposer, wherein the filling material inside the opening covers upper, lower and side surfaces of the interposer, and
    an upper covering layer covering an upper surface of the core layer and an upper surface of the filling material in the opening, and
    a lower covering layer covering a lower surface of the core layer and a lower surface of the filling material in the opening.

18. The packaging substrate of claim 16, wherein
the first dielectric layer is in direct surface contact with the first main layer, is more flexible than the first, second and third main layers, and has a thickness greater than the thickness of each of the first and second adhesive layers, and
a conductive material and a sidewall of each of the conductive through vias extend continuously, without interruption, through the first dielectric layer, the first main layer, the first adhesive layer, the second main layer, the second adhesive layer, and the third main layer.

19. The packaging substrate of claim 18, wherein
the second dielectric layer is in direct surface contact with the third main layer, is more flexible than the first, second and third main layers, and has a thickness greater than the thickness of each of the first and second adhesive layers, and
the conductive material and the sidewall of each of the conductive through vias extend continuously, without interruption, through the first dielectric layer, the first main layer, the first adhesive layer, the second main layer, the second adhesive layer, the third main layer and the second dielectric layer.

20. A packaging substrate, comprising:
a carrying structure; and
an interposer embedded in the carrying structure and comprising:
    a composite body comprising:
        a first main layer of a material selected from the group consisting of glass, silicon and ceramic,
        a second main layer of a material selected from the group consisting of glass, silicon and ceramic,
        a third main layer of a material selected from the group consisting of glass, silicon and ceramic,
        a first adhesive layer disposed between the first main layer and the second main layer, wherein the first adhesive layer is in direct surface contact with the first and second main layers and combines the first main layer to the second main layer, and
        a second adhesive layer disposed between the second main layer and the third main layer, wherein the second adhesive layer is in direct surface contact with the second and third main layers and combines the second main layer to the third main layer; and
a plurality of conductive through vias passing through the composite body,
wherein
a thickness of each of the first and second adhesive layers is smaller than a thickness of each of the first, second and third main layers,
the composite body has a first outermost layer that is a first dielectric layer,
the first dielectric layer is in direct surface contact with the first main layer, is more flexible than the first, second and third main layers, and has a thickness greater than the thickness of each of the first and second adhesive layers, a conductive material of each of the conductive through vias extends continuously, without interruption, through the first dielectric layer, the first main layer, the first adhesive layer, the second main layer, the second adhesive layer, and the third main layer, the composite body has a second outermost layer that is a second dielectric layer, the second dielectric layer is in direct surface contact with the third main layer, is more flexible than the first, second and third main layers, and has a thickness greater than the thickness of each of the first and second adhesive layers, the conductive material of each of the conductive through vias extends continuously, without interruption, through the first dielectric layer, the first main layer, the first adhesive layer, the second main layer, the second adhesive layer, the third main layer and the second dielectric layer, and the thickness of each of the first and second dielectric layers is less than 10 μm.

\* \* \* \* \*